United States Patent
Gao et al.

(10) Patent No.: US 8,373,481 B2
(45) Date of Patent: Feb. 12, 2013

(54) SPUR REDUCTION TECHNIQUE FOR SAMPLING PLL'S

(75) Inventors: Xiang Gao, San Jose, CA (US); Ahmad Bahai, Lafayette, CA (US); Mounir Bohsali, Danville, CA (US); Ali Djabbari, Saratoga, CA (US); Eric Klumperink, Lichtenvoorde (NL); Bram Nauta, Borne (NL); Gerard Socci, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 108 days.

(21) Appl. No.: 12/973,353

(22) Filed: Dec. 20, 2010

(65) Prior Publication Data

US 2012/0154003 A1    Jun. 21, 2012

(51) Int. Cl.
*H03L 7/06* (2006.01)
(52) U.S. Cl. .......................... 327/159; 327/149; 327/158
(58) Field of Classification Search .................. 327/149, 327/158, 159
See application file for complete search history.

(56) References Cited

U.S. PATENT DOCUMENTS

| | | | |
|---|---|---|---|
| 6,055,286 A | 4/2000 | Wu et al. | |
| 6,081,572 A | 6/2000 | Filip | |
| 7,737,743 B1 * | 6/2010 | Gao et al. | 327/158 |
| 7,990,194 B2 * | 8/2011 | Shim | 327/158 |
| 8,253,455 B2 * | 8/2012 | Hyun et al. | 327/147 |
| 2006/0222134 A1 * | 10/2006 | Eldredge et al. | 375/371 |
| 2007/0285177 A1 * | 12/2007 | Werker | 331/16 |
| 2008/0218274 A1 * | 9/2008 | Clementi | 331/16 |
| 2009/0074126 A1 * | 3/2009 | Song | 375/376 |
| 2010/0295621 A1 * | 11/2010 | Mar | 331/18 |
| 2012/0062292 A1 * | 3/2012 | Sai | 327/157 |
| 2012/0154003 A1 * | 6/2012 | Gao et al. | 327/159 |

OTHER PUBLICATIONS

Anand et al., "A CMOS Clock Recovery Circuit for 2.5-Gb/s NRZ Data" IEEE Journal of Solid-State Circuits, vol. 36, No. 3, Mar. 2001, pp. 432-439.
Maulik et al., "A 150 MHz-400MHz DLL-Based Programmable Clock Multiplier with -70dBc Reference Spur in 0.18um CMOS", IEEE 2006, CICC, pp. 757-760.
Desgrez et al., "A New MMIC Sampling Phase Detector Design for Space Applications", IEEE Journal of Solid State-Circuits, vol. 38, No. 9, Sep. 2003, pp. 1438-1442.
Gao et al., "A 2.2GHz 7.6mW Sub-Sampling PLL with -126dBc/Hz In-band Phase Noise and 0.15ps RMS Jitter in 0.18um CMOS",IEEE Int. Solid-State Circuits Conf.(ISSCC), pp. 392-393.
Gao et al., "Sampling Phase Dectector and Charge Pump with Pulse Width Control", US Patent pending, filed as IDF P07120 in Mar. 2008.
Gao et al., "Spur Reduction Technique for Sampling PLLs", summary of invention submitted Mar. 2009.
U.S. Appl. No. 12/973,323 for Low Power and Low Spur Sampling PLL, 15 pages.

* cited by examiner

*Primary Examiner* — Adam Houston
(74) *Attorney, Agent, or Firm* — Andrew S. Viger; Wade J. Brady, III; Frederick J. Telecky, Jr.

(57) ABSTRACT

Control circuitry and method of controlling for a sampling phase lock loop (PLL). By controlling the duty cycle of a sampling control signal, in accordance with the PLL reference and output signals, spurious output signals from the sampling PLL being controlled can be reduced.

20 Claims, 6 Drawing Sheets

SPUR REDUCTION TECHNIQUE FOR SAMPLING PLL'S

BACKGROUND

1. Field of the Invention

The present invention relates to sampling phase lock loops, in a particular, to control circuitry for sampling phase lock loops for reducing power consumption and spurious output signals.

2. Related Art

Figure 1:
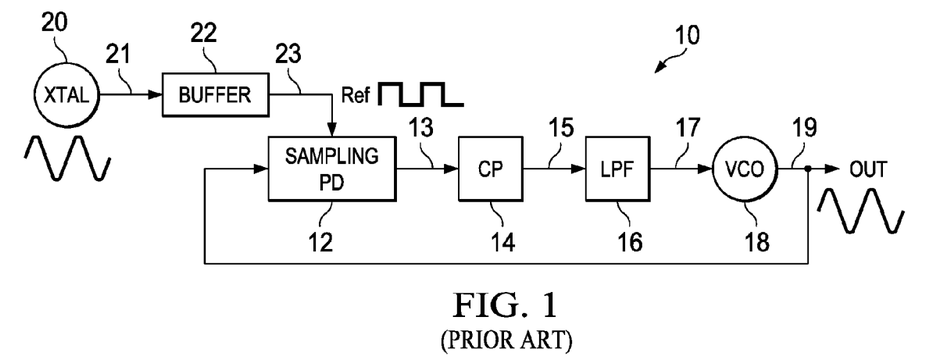
FIG. 1 is a functional block diagram of a conventional sampling PLL with its input reference buffer circuitry.

Referring to FIG. 1, a conventional phase lock loop (PLL) 10 includes a sampling phase detector 12, followed by a charge pump 14, a low pass filter 16 and a controllable signal source 18, typically a voltage controlled oscillator (VCO). An external reference signal source 20, often in the form of a crystal oscillator, provides a reference signal 21 which is buffered by a buffer amplifier 22 to convert the sine wave input signal 21 to a square wave reference signal 23. In accordance with this buffered reference signal 23, the sampling phase detector 12 samples the VCO output signal 19. The sampled signal 13 drives the charge pump 14, the output of which is filtered by the low pass filter 16 to produce the DC control signal 17 for the VCO 18.

Figure 2:
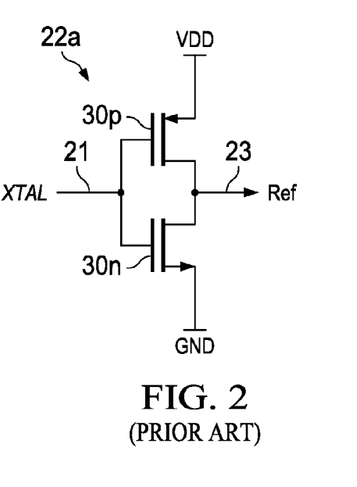
FIG. 2 is a schematic diagram of a conventional inverting reference buffer circuit.

Referring to FIG. 2, the reference buffer circuit 22 is often implemented as an inverter circuit 22a (or multiple such inverters 22a connected in series). In accordance with well known principles, during positive extremes of the input signal 21, the NMOS transistor 30n is turned on and the PMOS transistor 30p is turned off. Conversely, during negative extremes of the input signal, the PMOS transistor 30p is turned on and the NMOS transistor 30n is turned off. This produces the output square wave signal 23 having negative and positive signal excursions, respectively. However, between such positive and negative signal extremes, both transistors 30p, 30n will be conductive.

Figure 3:
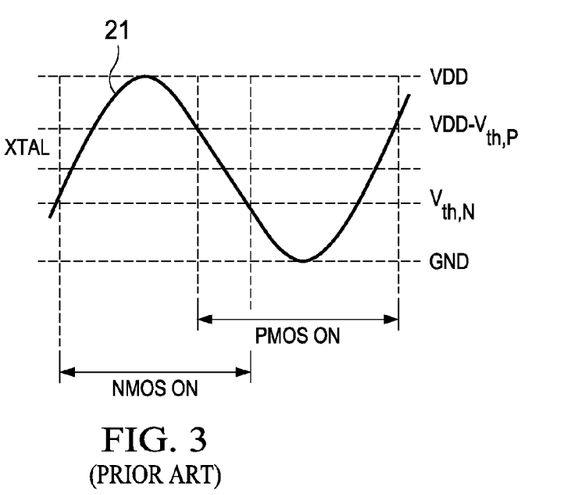
FIG. 3 is a signal timing diagram for the operation of the circuit of FIG. 2.

Referring to FIG. 3, this implementation 22a of the buffer circuitry 22 draws a significant amount of current from the power supply VDD. In order to achieve low PLL output signal 19 jitter, large transistor sizes are required for low reference clock signal noise. Accordingly, the large transistors 30p, 30n required for the inverting buffer circuit 22a can dominate the power consumption of the overall sampling PLL circuitry. As seen in the Figure, when the input sine wave voltage 21 is higher than the NMOS transistor 30n threshold voltage $V_{th,N}$, the NMOS transistor 30n is conducting. When the input voltage 21 is lower than the power supply voltage VDD minus the PMOS transistor 30p threshold voltage VDD-$V_{th,P}$, the PMOS transistor 30p is conducting. Since the power supply voltage VDD is typically larger than the sum of the threshold voltages, there will be a time interval when both the NMOS 30n and PMOS 30p transistors are conducting. This results in a direct path current that flows from the power supply VDD to circuit ground GND. This direct path current is not fundamentally required for a circuit operation, and is, therefore, a waste of power. In some cases such direct path current can account for more than 90% of the total power for the inverter circuit 22a.

Figure 4:
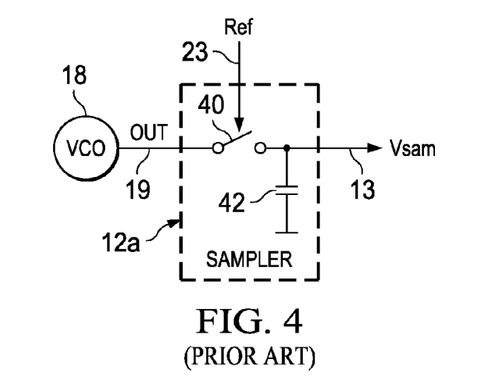
FIG. 4 is a schematic diagram of a conventional sampling circuit.

Referring to FIG. 4, the sampling circuitry 12 (FIG. 1) is typically implemented as a sampler circuit 12a having a series switch 40 and shunt capacitance 42. The switch 40 is opened and closed in accordance with the mutually opposed signal states of the square wave reference signal 23. This produces the sampled voltage 13 which is stored on the shunt capacitance 42 during the time intervals that the switch 40 is opened.

Figure 5:
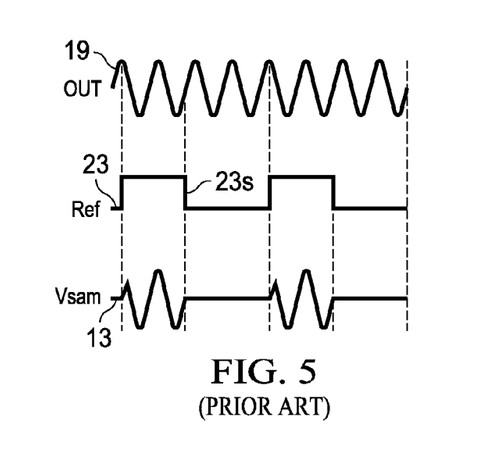
FIG. 5 is a signal timing diagram for the circuitry of FIG. 4.

Referring to FIG. 5, the switching activity of such a sampler 12a tends to disturb operation of the VCO 18, thereby producing spurious output signals within the VCO output signal 19.

Figure 6:
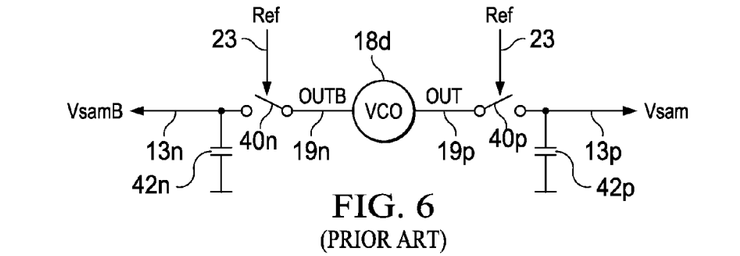
FIG. 6 is a schematic diagram of a differential embodiment of the sampler circuitry of FIG. 4.

Referring to FIG. 6, in accordance with well known principles, differential circuitry can also be used as part of the PLL circuit 10. In such an implementation, the VCO 18d produces a differential output signal having mutually opposed positive 19p and negative 19n signal phases which are separately sampled by switches 40p, 40n controlled by the preferred reference signal 23, and stored on sampling capacitances 42p, 42n to produce positive 13p and negative 13n phases of a differential sampled signal voltage.

As noted above, the switch 40 (FIG. 4) is closed when the reference signal 23 is asserted (e.g., high) and open when the reference signal 23 is de-asserted (e.g., low). The sampling edge 23s is aligned in phase to a rising edge of the output signal 19. When the switch 40 is turned off, the sampled output voltage 13 is well defined and equal to the DC component of the VCO output voltage 19. This also means that when the switch 40 is turned on again the voltage 13 on the sampling capacitance 42 will be equal to this DC voltage component. However, the VCO voltage 19 at the moment that the switch 40 is turned on may not be equal to its DC component. This results in charge sharing between the output of the VCO 18 and the capacitance 42 in the sampler 12a.

In other words, the switching activity of the sampler 12a periodically changes the loading of the output of the VCO 18. During the on time of the switch 40, the VCO output is loaded by the sampling capacitance 42, while during the off time of the switch 40, the VCO is disconnected and not loaded by the sampling capacitance 42. This change in loading produces changes in the frequency of the VCO output signal 19. The switch 40 is often implemented with a MOS transistor operating in its triode region. When the transistor is turned on or off, the channel charge within the MOS transistor is built or released and absorbed from or injected into, respectively, the output of the VCO 18. This results in spurious output signals being generated within the VCO output signal 19. In radio receiver applications, such spurious signals mixes undesirably in the channel bandwidth, thereby degrading the signal-to-noise ratio (SNR), and in clock data recovery applications, such spurious signals translate to peak-to-peak jitter, thereby increasing the bit error rate (BER).

Accordingly, it would be desirable to provide better control of a sampling PLL such that power supply consumption is reduced and spurious output signals are minimized.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. To the extent that the figures illustrate diagrams of the functional blocks of various embodiments, the functional blocks are not necessarily indicative of the division between hardware circuitry.

In accordance with the presently claimed invention, control circuitry and a method of controlling a sampling phase lock loop (PLL) are provided. By controlling the duty cycle of a sampling control signal, in accordance with the PLL reference and output signals, spurious output signals from the sampling PLL being controlled can be reduced.

In accordance with one embodiment of the presently claimed invention, control circuitry for a sampling phase lock loop (PLL) includes:

a first electrode for conveying a PLL reference signal;

a second electrode for conveying a PLL output signal from a sampling PLL;

a third electrode for conveying to the sampling PLL a sampling control signal having a duty cycle; and sampling control circuitry coupled to the first, second and third electrodes, and responsive to the PLL reference signal and the PLL output signal by providing the sampling control signal, wherein the PLL output signal has a PLL signal frequency and a corresponding PLL signal period, and the PLL signal frequency is related to the duty cycle.

In accordance with another embodiment of the presently claimed invention, a computer readable medium includes a plurality of executable instructions that, when executed by an integrated circuit design system, cause the integrated circuit design system to produce an integrated circuit (IC) that includes:

a first electrode for conveying a PLL reference signal;

a second electrode for conveying a PLL output signal from a sampling PLL;

a third electrode for conveying to the sampling PLL a sampling control signal having a duty cycle; and sampling control circuitry coupled to the first, second and third electrodes, and responsive to the PLL reference signal and the PLL output signal by providing the sampling control signal, wherein the PLL output signal has a PLL signal frequency and a corresponding PLL signal period, and the PLL signal frequency is related to the duty cycle.

In accordance with still another embodiment of the presently claimed invention, a method of controlling a sampling phase lock loop (PLL) includes:

receiving a PLL reference signal;

receiving a PLL output signal from a sampling PLL; and generating, responsive to the PLL reference signal and the PLL output signal for the sampling PLL, a sampling control signal having a duty cycle, wherein the PLL output signal has a PLL signal frequency and a corresponding PLL signal period, and the PLL signal frequency is related to the duty cycle.

Figure 7:
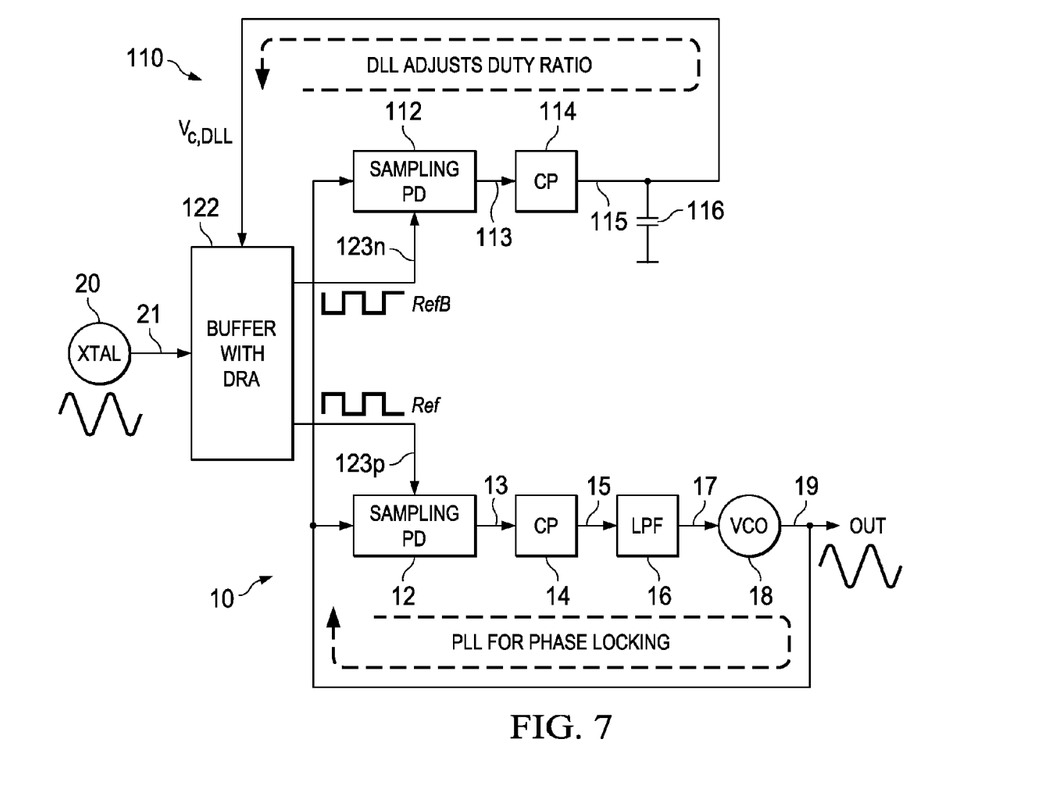
FIG. 7 is a functional block diagram of a sampling PLL driven by reference buffer circuitry in accordance with an exemplary embodiment.

Referring to FIG. 7, in accordance with an exemplary embodiment, the sampling PLL 10 is driven by a buffered reference signal 123*p* generated by buffer circuitry 122 including duty ratio adjustment (DRA) circuitry (discussed in more detail below), which, in turn, is controlled by a delay locked loop (DLL) 110. The DLL 110 includes a sampling phase detector 112 (e.g., a sampler 12*a* as depicted in FIG. 4), a charge pump 114 and low pass filter 116, similar to the sampling PLL 10. The filtered voltage 115 serves as the control signal for the buffer circuitry 122.

Figure 8:
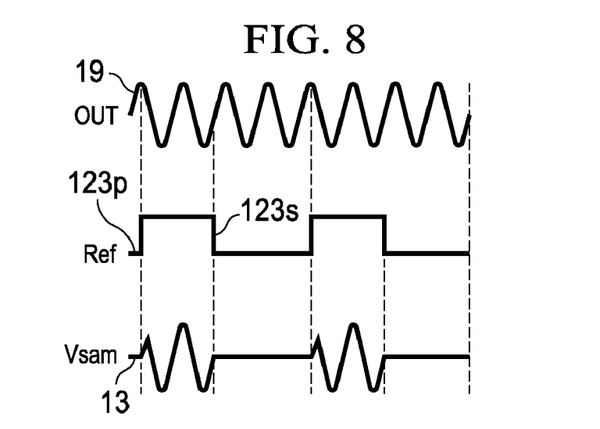
FIG. 8 is a signal timing diagram of the operation of a sampling circuit using a reference signal in accordance with an exemplary embodiment.

Referring to FIG. 8, as discussed in more detail below, the buffer circuitry 122 produces the reference signal 123*p* for the sampling PLL 10 and a related reference signal 123*n* for the DLL 110 such that the sampling duration, e.g., the duration of the asserted state of the reference signal 123*p*, is an integer multiple of the period of the VCO output signal 19. Accordingly, the instantaneous DC voltage component of the VCO output signal 19 is the same as the reference signal 123*p* transitions between its mutually opposed asserted and de-asserted signal states. As a result, charge sharing between the sampling capacitance 42 (FIG. 4) and the output stage of the VCO 18 is minimized, if not eliminated entirely.

Figure 9:
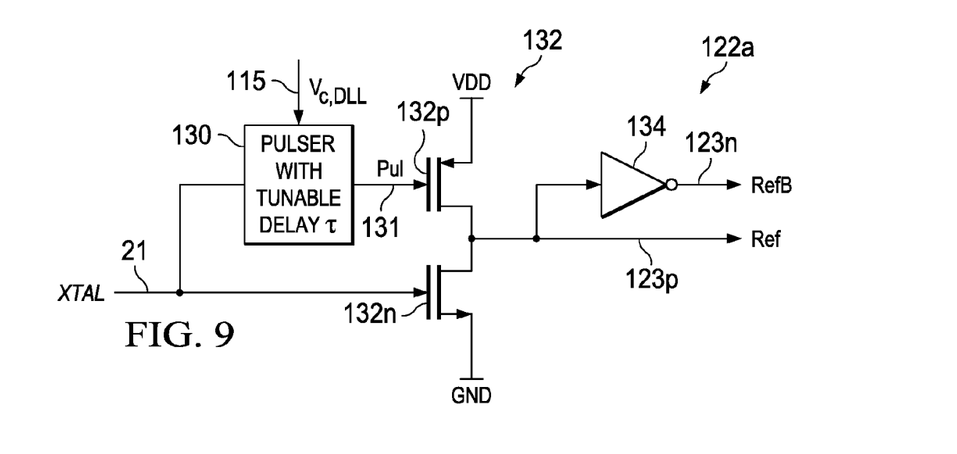
FIG. 9 is a schematic diagram of an exemplary embodiment of the buffer circuitry of FIG. 7.

Referring to FIG. 9, an exemplary embodiment 122*a* of the buffer circuitry 122 includes pulser circuitry 130, an inverting buffer 132 implemented with PMOS 132*p* and NMOS 132*n* transistors, and logic inverter circuitry 134. The pulser circuitry 130 has a tunable delay which is controlled by the output signal 115 of the DLL 110. The resulting signal pulse 131 drives the PMOS transistor 132*p* of the inverting buffer 132, while the original reference signal 21 drives the NMOS transistor 132*n*. The output of the inverting buffer circuitry 132 serves as the sampling control signal 123*p* for the sampling PLL 10, while its inverse serves as the sampling control signal 123*n* for the DLL 110.

Figure 10:
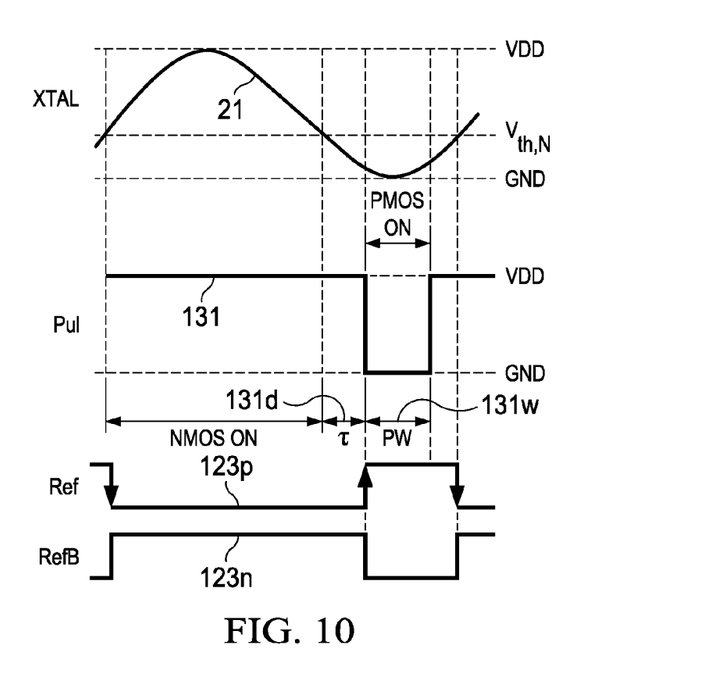
FIG. 10 is a signal timing diagram for the circuitry of FIG. 9.

Referring to FIG. 10, as a result, the sampling PLL control signal 123*p* and DLL control signal 123*n* ensure that the duty ratio of such signals 123*p*, 123*n* is such that the duration of the assertion state of the sampling PLL control signal 123*p* is in integer multiple of the period of the VCO output signal 19

(FIG. 8). When phase lock is achieved, the sampling PLL 10 aligns a rising edge of the VCO output signal 19 with its sampling edge 123s, while the DLL 110 aligns its sampling edge, i.e., the falling edge of its control signal 123n, with another rising edge of the VCO output signal 19. Since these control signals 123p, 123n are complementary, the DLL 110 also aligns the rising edge of the sampling PLL control signal 123p with the rising edge of the VCO output signal 19. As a result, both the rising and falling edges of the sampling PLL control signal 123p are phased aligned to a rising edge of the VCO output signal 19. This ensures that the switch on-time (duration of assertion) of the sampling PLL control signal 123p (and similarly the DLL sampling control signal 123n) is defined to be an integer multiple of the period of the VCO output signal 19.

As will be readily appreciated, the additional delay of the inverter circuitry 134 can be compensated in the signal path for the sampling PLL control signal 123p by adding a transmission gate in series (not shown). Since the DLL 110 controls the rising edge of the sampling PLL control signal 123p, which is not the sampling edge, the DLL 110 will not add noise nor disturb the operation of the sampling PLL 110.

By adding the DLL 110, the capacitance loading the VCO 18 is kept constant over time. The sampling phase detectors 12, 112 should be substantially the same. With complementary sampling control signals 123p, 123n, the sampling operations of the sampling phase detectors 12, 112 are mutually exclusive, i.e., when one sampling phase detector is on, the other sampling phase detector is off. As a result, the VCO 18 is always loaded by one sampling phase detector, and such loading does not change with switching. Further, any charge injection from the switch in one sampling phase detector will be largely absorbed by the switched capacitance in the other sampling phase detector, and will cause minimal disturbance to operation of the VCO 18.

Referring to FIG. 10, the direct path current conduction through the inverting buffer circuit 132 can be minimized by a proper choice of the timing within the pulser circuit 130. When the incoming reference signal 21 is higher than the NMOS transistor 132n threshold voltage, the NMOS transistor is turned on. When the pulser output signal 131 is lower than the difference between the power supply voltage VDD and the PMOS transistor 132p threshold voltage, the PMOS transistor 132p is turned on. By an appropriate choice of the pulser delay 131d and the pulse with 131w, it can be ensured that the conduction, or turned on, times of the NMOS 132n and PMOS 132p transistors are mutually exclusive, i.e., non-overlapping. This eliminates direct path current conduction through the inverting buffer circuitry 132, thereby significantly reducing power consumption of the buffer circuitry 132.

Figure 11:
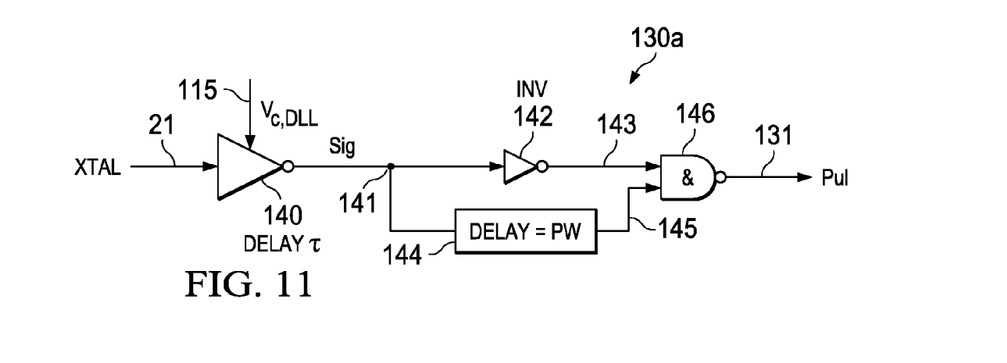
FIG. 11 is a schematic diagram of an exemplary embodiment of the pulser circuitry of FIG. 9.

Referring to FIG. 11, an exemplary embodiment 130a of the pulser circuitry 130 includes inverter circuitry 140 with a controllable delay in accordance with the DLL output signal 115, additional inverter circuitry 142, additional delay circuitry 144 and signal combining circuitry 146 in the form of a logical NAND gate. The delay of the input inverter circuitry 140 can be tuned using well-known techniques, such as adding tunable shunt capacitances to the output circuitry of the inverter 140, or tuning charging or discharging current within the inverter circuitry 140. This controllable delayed signal 141 is inverted by the second inverter circuitry 142 and delayed by the second delay circuitry 144, with the resulting inverted 143 and delayed 145 signals being combined by the logic gate 146 to produce the pulsed signal 131.

Figure 12:
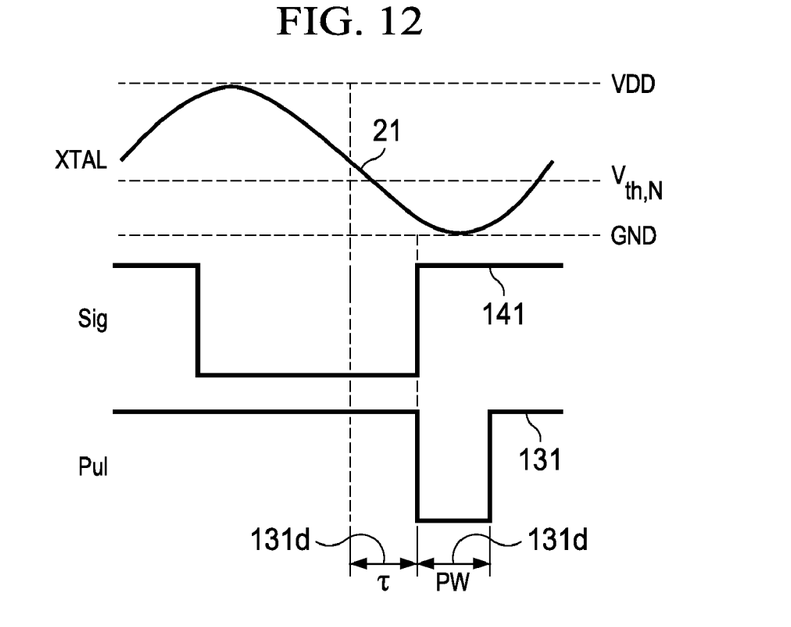
FIG. 12 is a signal timing diagram for the circuitry of FIG. 11.

Referring to FIG. 12, such operation of this circuitry 130a produces the pulsed signal 131 with the delay 131d and pulse width 131w as discussed above.

Figure 13:
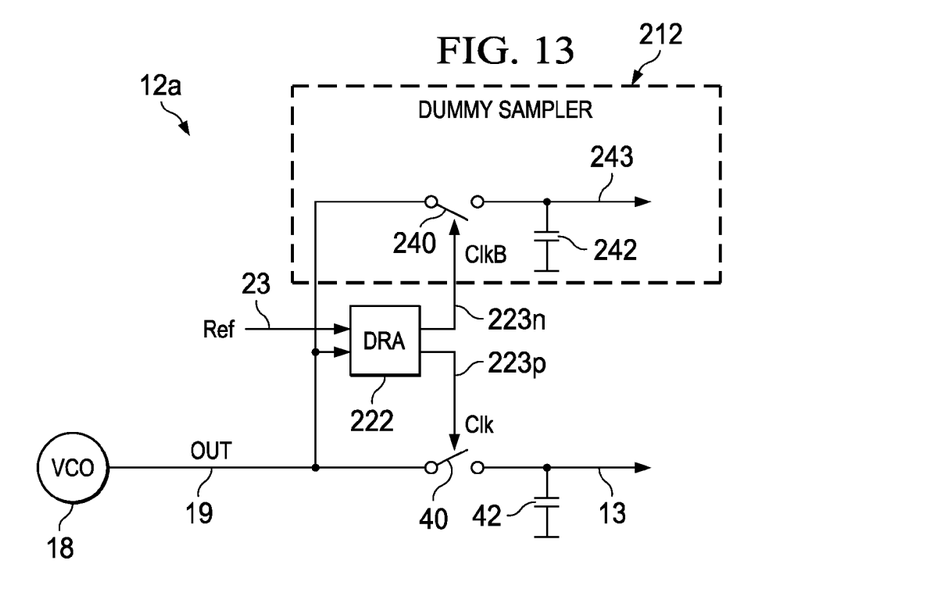
FIG. 13 is a schematic diagram of sampling control circuitry in accordance with another exemplary embodiment.

Referring to FIG. 13, in accordance with another exemplary embodiment, control circuitry for the sampling PLL 10 includes sampling control circuitry in the form of duty ratio adjustment (DRA) circuitry 222. This control circuitry 222 (discussed in more detail below) processes the buffered reference signal 23 and VCO output signal 19 to produce the sampling control signal 223p for controlling the samplings switch 40 such that the duration of the asserted state of this control signal 223p is equal to an integer multiple of the period of the VCO output signal 19, as discussed above with reference to FIG. 8.

As a further alternative embodiment, a dummy sampler circuit 212 can be included which receives a switch control signal 223n from the sampling control circuitry 222 to control a sampling switch 240 for also sampling the VCO output signal 19. This switch control signal 223n is complementary to the switch control signal 223p for the sampler 12a. By the including the dummer sampler 212, which is driven by a sampling control signal 223n complementary to the sampling control signal 223p of the sampling PLL10, the VCO 18 will always be loaded by one sampler 12a, 212 since one switch is always on while another switch is always off, similar to the discussion above for the complementary sampling phase detectors 12, 112 of FIG. 7.

Figure 14:
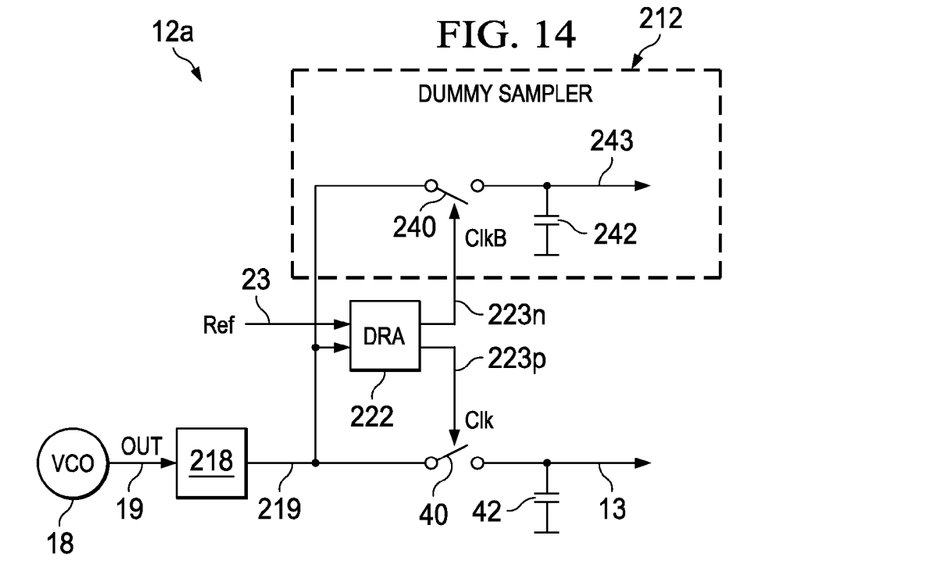
FIG. 14 is a schematic diagram of sampling control circuitry in accordance with another exemplary embodiment.

Referring to FIG. 14, in a further alternative embodiment, a series resistance 218 can be included at the output of the VCO 18. Such resistance 218 helps compensate for the difference in the on-resistances of the switches 40, 240, which can affect the loading of the VCO 18 as much as the charging and discharging of the sampling capacitances 42, 242 through the switches 40, 240. As is well known, the transient behavior of the charging and discharging is governed by the RC time constant, and MOS transistors used as switches often have bad matching properties, particularly as the switching transistor size is often desired to be small for minimal parasitic capacitances and low charge injection. Accordingly, this additional series resistance 218 is larger than the on-resistance of the switches 40, 240, and is, therefore, the primary controlling factor in the RC time constant. This results in better matching and more consistent loading for the VCO 18, and, therefore, better prevention of output spurious signals.

Figure 15:
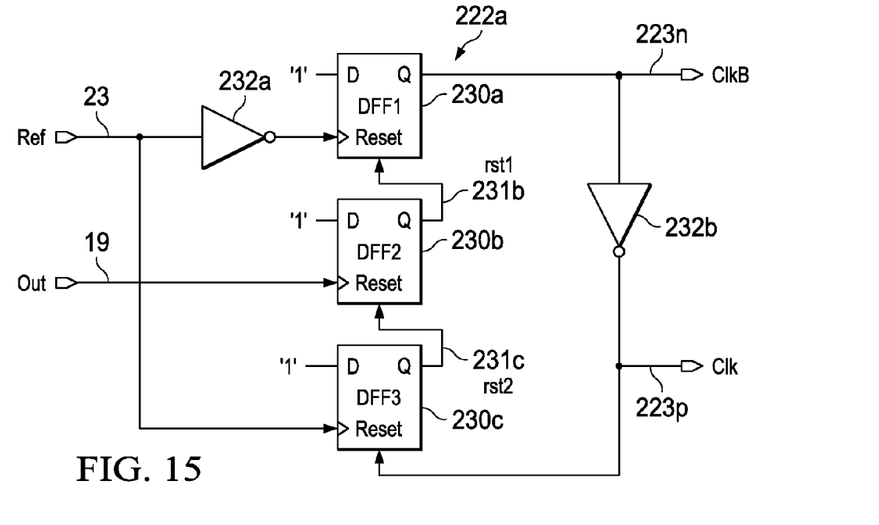
FIG. 15 is a schematic diagram of an exemplary embodiment of the sampling control circuitry of FIGS. 13 and 14.

Referring to FIG. 15, an exemplary embodiment 222a of the sampling control signal 222 is implemented using synchronous logic circuitry. In accordance with a preferred embodiment, this synchronous logic circuitry includes a plurality of D-type flip-flops 230a, 230b, 230c, plus logic inverters 232a, 232b. The data inputs D are tied high, while the Q outputs 231c, 231b, 223n serve as reset signals, with one Q output signal 223n serving as the complementary sampling control signal 223n, which is inverted to provide the primary sampling control signal 223p. The buffer reference signal 23 and VCO output signal 19 serve as clock signals for the flip-flops 230a, 230b, 230c, as shown.

Figure 16:
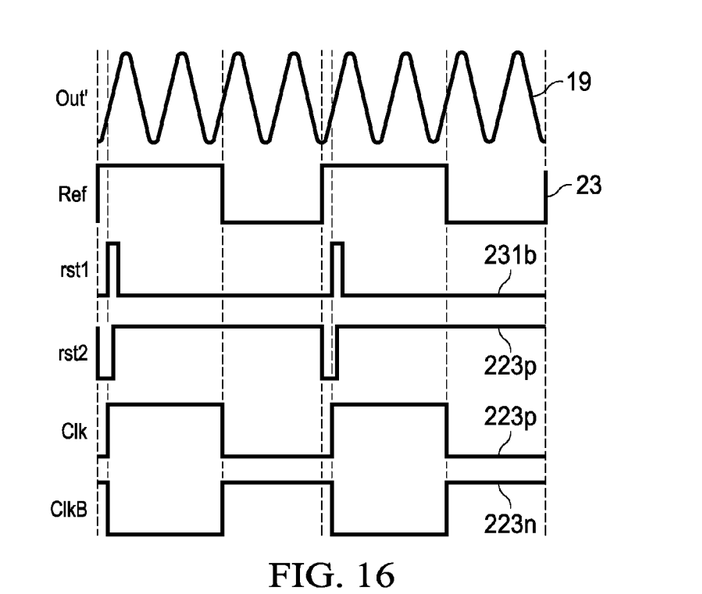
FIG. 16 is a signal timing diagram for the circuitry of FIG. 15.

Referring to FIG. 16, the relative phase relationships of the VCO output 19, buffered reference 23, reset 231b, 231c and switch control 223p, 223n signals are produced as a result of such signal interconnections. As discussed above, the switch control signals 223p, 223n are complementary and have asserted states with durations equal to an integer multiple of the period of the VCO output signal 19.

Figure 17:
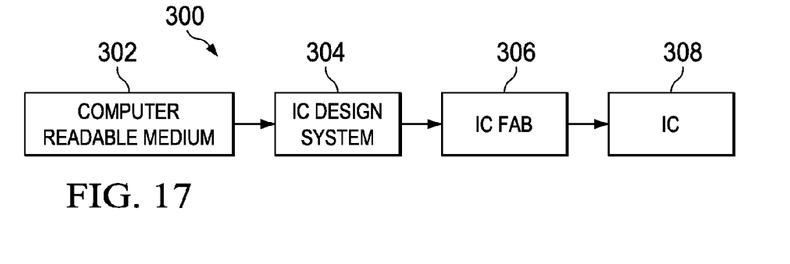
FIG. 17 is a functional block diagram of an exemplary embodiment of an integrated circuit design and fabrication system operated in accordance with computer instructions.

Referring to FIG. 17, integrated circuit (IC) design systems 304 (e.g., work stations with digital processors) are known that create integrated circuits based on executable instructions stored on a computer readable medium 302, e.g., including memory such as but not limited to CD-ROM, DVD-ROM, other forms of ROM, RAM, hard drives, distributed memory, or any other suitable computer readable medium. The instructions may be represented by any programming language, including without limitation hardware descriptor language (HDL) or other suitable programming languages. The computer readable medium contains the executable instructions (e.g., computer code) that, when executed by the IC design system 304 (e.g., by a work station or other form of computer), cause an IC fabrication system 306 to produce an IC 308 that includes the devices or circuitry as set forth herein. Accordingly, the devices or circuits described herein may be produced as ICs 308 by such IC design systems 304 executing such instructions.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A circuit, comprising:
a sampling phase locked loop (PLL) circuit configured to generate a PLL output signal at a predetermined PLL frequency;
a reference circuit responsive to a reference clock signal and configured to generate a sampling control signal with a duty cycle defined by a sampling edge and a signal edge, the sampling edge and the signal edge defining a sampling duration that is substantially an integer multiple of the period of the PLL output signal;
the sampling PLL circuit including a sampling phase detector circuit receiving the PLL output signal and responsive to the sampling control signal to sample the PLL output signal at the associated sampling edge, and generate a corresponding PLL control signal;
such that the sampling PLL circuit is responsive to the PLL control signal to phase lock the PLL output signal to the reference clock signal.

2. The circuit of claim 1:
wherein the reference circuit is configured to generate an inverse sampling control signal that is the inverse of the sampling control signal such that a sampling edge of the inverse sampling control signal corresponds to the signal edge of the sampling control signal; and
wherein the sampling PLL circuit includes a second sampling phase detector circuit receiving the PLL output signal and the inverse sampling control signal;
such that the sampling PLL circuit is alternately loaded by the sampling phase detector circuit and the second sampling phase detector circuit.

3. The circuit of claim 1:
wherein the reference circuit is configured to generate an inverse sampling control signal that is the inverse of the sampling control signal such that a sampling edge of the inverse sampling control signal corresponds to the signal edge of the sampling control signal;
wherein the sampling PLL circuit includes a delay locked loop (DLL) circuit including a second phase detector circuit receiving the PLL output signal and responsive to the inverse sampling control signal to sample the PLL output signal at the associated sampling edge (corresponding to the signal edge of the sampling control signal) and provide a DLL control signal; and
wherein the reference circuit includes a controllable delay circuit responsive to the DLL control signal to controllably delay the signal edge of the sampling control signal and thereby the sampling edge of the inverse sampling control signal such that the sampling duration of the inverse sampling control signal is substantially an integer multiple of the period of the PLL output signal.

4. The circuit of claim 3, wherein a clock oscillator provides a sine wave reference clock signal, and wherein the reference circuit comprises a buffer circuit configured to convert the reference clock signal into the sampling control signal with a square wave duty cycle, the buffer circuit comprising:
a pull-high transistor and a pull-low transistor coupled in series with a buffer output node between the transistors;
a pulser circuit configured as the controllable delay circuit coupled to receive the reference clock signal and the DLL control signal, and configured to generate a switch control pulse with a leading switch-on edge corresponding to the reference clock signal decreasing below a voltage threshold associated with the pull-low transistor, delayed by a DLL delay corresponding to the DLL control signal;
the pull-high transistor having a switch control input coupled to receive the reference clock signal such that, during each period of the reference clock signal, the pull-high transistor switches on and transitions the buffer output node high when the reference clock signal increases above a voltage threshold associated with the pull-high transistor, thereby defining the sampling edge of the sampling control signal; and
the pull-low transistor having a switch control input coupled to receive the switch control pulse such that, during each period of the reference clock signal, the pull-low transistor switches on at the switch-on edge of the switch control pulse and transitions the buffer output node low, thereby defining the signal edge of the sampling control signal in accordance with the reference clock signal and the DLL delay;
the buffer circuit outputting the sampling control signal at the buffer output node, and outputting the inverse sampling control signal at the output of an inverter coupled to the buffer output node.

5. The circuit of claim 4:
wherein the pulser circuit includes pulse width control circuitry configured to set a switch-off edge of the switch control pulse at a selectable pulse width after the switch-on edge such that the switch control pulse is defined by the switch-on edge, the switch-off edge and the selectable pulse width; and
wherein the pull-low transistor is responsive to the switch control pulse to switch on at the switch-on edge and switch off at the switch-off edge.

6. The circuit of claim 5, wherein the predetermined pulse width is defined relative to the switch-off edge of the switch control pulse such that the pull-low transistor is switched off before the pull-high transistor is switched on.

7. The circuit of claim 1 wherein the sampling PLL circuit further comprises:
a charge pump circuit coupled to the sampling phase detector circuit and responsive to the PLL control signal to generate a VCO control signal; and
a voltage controlled oscillator (VCO) circuit configured to generate the PLL output signal and responsive to the VCO control signal to control the phase of the PLL output signal, and thereby phase lock to the PLL output signal to the reference clock signal.

8. A method of controlling a sampling phase locked loop (PLL) generating a PLL output signal at a predetermined PLL frequency, comprising:
receiving a reference clock signal;
generating a sampling control signal with a duty cycle defined by a sampling edge and a signal edge, the sampling edge and the signal edge defining a sampling duration that is substantially an integer multiple of the period of the PLL output signal;
sampling, in response to the sampling control signal, the PLL output signal at the associated sampling edge, and generating a corresponding PLL control signal; and
locking, in response to the PLL control signal, a phase of the PLL output signal to a phase of the reference clock signal.

9. The method of claim 8, further comprising:
generating an inverse sampling control signal that is the inverse of the sampling control signal such that a sampling edge of the inverse sampling control signal corresponds to the signal edge of the sampling control signal; and
sampling, in response to the inverse sampling control signal, the PLL output signal at the associated sampling edge (corresponding to the signal edge of the sampling control signal), and generating a corresponding DLL control signal;
delaying, in response to the DLL control signal, the signal edge of the sampling control signal, which corresponds to the sampling edge of the inverse sampling control signal, such that the sampling duration of the inverse sampling control signal is substantially an integer multiple of the period of the PLL output signal.

10. The method of claim 8, wherein a clock oscillator provides a sine wave reference clock signal, and wherein a buffer circuit, with a buffer output node, is configured to convert the reference clock signal into the sampling control signal with a square wave duty cycle, by:
transitioning the buffer output node high when the reference clock signal increases above a first voltage level, thereby defining the sample edge of the sampling control signal;
transitioning the buffer output node low when the reference clock signal decreases below a second voltage level delayed by a DLL delay generated in response to a DLL control signal, thereby establishing the signal edge of the sampling control signal in accordance with the reference clock signal and the DLL delay, such that the sampling duration of the sampling control signal is substantially an integer multiple of the period of the PLL output signal;
generating an inverse sampling control signal that is the inverse of the sampling control signal such that a sampling edge of the inverse sampling control signal corresponds to the signal edge of the sampling control signal; and
sampling, in response to the inverse sampling control signal, the PLL output signal at the associated sampling edge (corresponding to the signal edge of the sampling control signal), and generating the corresponding DLL control signal used to generate the DLL delay and thereby establish the signal edge of the sampling control signal (corresponding to the sampling edge of the inverse sampling control signal).

11. The method of claim 10, wherein the buffer circuit includes a pull-high transistor and a pull-low transistor coupled in series with a buffer output node between the transistors, wherein the first voltage level corresponds to a switch-on voltage of the pull-high transistor and the second voltage level corresponds to a switch-on voltage of the pull-low transistor, and wherein the buffer output node is transitioned high and low by:
generating the DLL delay in response to the DLL control signal;
generating a switch control pulse in response to the reference clock signal and the DLL delay, the switch control pulse having a leading switch-on edge corresponding to the reference clock signal decreasing below the second voltage level associated with the pull-low transistor delayed by the DLL delay;
controlling the pull-high transistor, responsive to the reference clock signal, to switch on when the reference clock signal increases above the switch-on voltage of the pull-high transistor thereby transitioning the buffer output node high, and thereby establishing the sampling edge of the sampling control signal; and
controlling the pull-low transistor, responsive to the switch control pulse, (a) to switch on at the switch-on edge of the switch control pulse, thereby transitioning the buffer output node low, and thereby establishing the signal edge of the sampling control signal, and (b) to switch off at the end of the switch control pulse.

12. The method of claim 11:
wherein generating the switch control pulse includes generating a selectable pulse width delay and thereby setting a switch-off edge of the switch control pulse, such that the switch control pulse is defined by the switch-on edge, the switch-off edge and the selectable pulse width delay;
wherein the pull-low transistor is responsive to the switch control pulse to switch on at the switch-on edge and switch off at the switch-off edge; and
wherein the predetermined pulse width is defined relative to the switch-off edge of the switch control pulse such that the pull-low transistor is switched off before the pull-high transistor is switched on.

13. The method of claim 1 wherein the sampling PLL includes a voltage controlled oscillator (VCO) for providing the PLL output signal, and wherein phase locking the PLL output signal to the reference clock signal comprises:
generating, in response to the PLL control signal, a VCO control signal; and
controlling, in response to the VCO control signal, the phase of the PLL output signal, and thereby phase lock to the PLL output signal to the reference clock signal.

14. A system, comprising:
a circuit configured to perform logic operations based on a PLL clock at a specified clock frequency;
a sampling phase locked loop (PLL) circuit configured to generate the PLL clock from a reference clock, the sampling PLL circuit operable to phase align the PLL clock with the reference clock; and
an oscillator circuit generating the reference clock;
the sampling PLL circuit comprising:
a reference circuit responsive to the reference clock and configured to generate a sampling control signal with a duty cycle defined by a sampling edge and a signal edge, the sampling edge and the signal edge defining a sampling duration that is substantially an integer multiple of the period of the PLL clock;
a sampling phase detector circuit receiving the PLL clock and responsive to the sampling control signal to sample the PLL clock at the associated sampling edge, and generate a corresponding PLL control signal;

such that the sampling PLL circuit is responsive to the PLL control signal to phase lock the PLL clock to the reference clock.

15. The system of claim 14:

wherein the reference circuit is configured to generate an inverse sampling control signal that is the inverse of the sampling control signal such that a sampling edge of the inverse sampling control signal corresponds to the signal edge of the sampling control signal; and wherein the sampling PLL circuit includes a second sampling phase detector circuit receiving the PLL clock and the inverse sampling control signal;

such that the sampling PLL circuit is alternately loaded by the sampling phase detector circuit and the second sampling phase detector circuit.

16. The system of claim 14:

wherein the reference circuit is configured to generate an inverse sampling control signal that is the inverse of the sampling control signal such that a sampling edge of the inverse sampling control signal corresponds to the signal edge of the sampling control signal;

wherein the sampling PLL circuit includes a delay locked loop (DLL) circuit including a second phase detector circuit receiving the PLL clock and responsive to the inverse sampling control signal to sample the PLL clock at the associated sampling edge (corresponding to the signal edge of the sampling control signal) and provide a DLL control signal; and wherein the reference circuit includes a controllable delay circuit responsive to the DLL control signal to controllably delay the signal edge of the sampling control signal and thereby the sampling edge of the inverse sampling control signal such that the sampling duration of the inverse sampling control signal is substantially an integer multiple of the period of the PLL clock.

17. The system of claim 16, wherein a clock oscillator provides a sine wave reference clock signal, and wherein the reference circuit comprises a buffer circuit configured to convert the reference clock signal into the sampling control signal with a square wave duty cycle, the buffer circuit comprising:

a pull-high transistor and a pull-low transistor coupled in series with a buffer output node between the transistors;

a pulser circuit configured as the controllable delay circuit coupled to receive the reference clock and the DLL control signal, and configured to generate a switch control pulse with a leading switch-on edge corresponding to the reference clock decreasing below a voltage threshold associated with the pull-low transistor, delayed by a DLL delay corresponding to the DLL control signal;

the pull-high transistor having a switch control input coupled to receive the reference clock such that, during each period of the reference clock, the pull-high transistor switches on and transitions the buffer output node high when the reference clock increases above a voltage threshold associated with the pull-high transistor, thereby defining the sampling edge of the sampling control signal; and the pull-low transistor having a switch control input coupled to receive the switch control pulse such that, during each period of the reference clock, the pull-low transistor switches on at the switch-on edge of the switch control pulse and transitions the buffer output node low, thereby defining the signal edge of the sampling control signal in accordance with the reference clock and the DLL delay;

the buffer circuit outputting the sampling control signal at the buffer output node, and outputting the inverse sampling control signal at the output of an inverter coupled to the buffer output node.

18. The system of claim 17:

wherein the pulser circuit includes pulse width control circuitry configured to set a switch-off edge of the switch control pulse at a selectable pulse width after the switch-on edge such that the switch control pulse is defined by the switch-on edge, the switch-off edge and the selectable pulse width; and wherein the pull-low transistor is responsive to the switch control pulse to switch on at the switch-on edge and switch off at the switch-off edge.

19. The system of claim 18, wherein the predetermined pulse width is defined relative to the switch-off edge of the switch control pulse such that the pull-low transistor is switched off before the pull-high transistor is switched on.

20. The system of claim 14 wherein the sampling PLL circuit further comprises:

a charge pump circuit coupled to the sampling phase detector circuit and responsive to the PLL control signal to generate a VCO control signal; and a voltage controlled oscillator (VCO) circuit configured to generate the PLL clock and responsive to the VCO control signal to control the phase of the PLL clock, and thereby phase lock to the PLL clock to the reference clock.

* * * * *